US012805145B2

(12) United States Patent
Bang et al.

(10) Patent No.: US 12,805,145 B2
(45) Date of Patent: Nov. 17, 2026

(54) DISPLAY DEVICE

(71) Applicant: Samsung Display Co., LTD., Yongin-si (KR)

(72) Inventors: Jin Sook Bang, Yongin-si (KR); Ilhoo Park, Yongin-si (KR); Jinouk Song, Yongin-si (KR); Sang Hoon Yim, Yongin-si (KR); Seong Jin Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 411 days.

(21) Appl. No.: 18/382,316

(22) Filed: Oct. 20, 2023

(65) Prior Publication Data

US 2024/0164170 A1 May 16, 2024

(30) Foreign Application Priority Data

Nov. 10, 2022 (KR) ........................ 10-2022-0149459

(51) Int. Cl.
*H10K 59/38* (2023.01)

(52) U.S. Cl.
CPC .................................... *H10K 59/38* (2023.02)

(58) Field of Classification Search
CPC ...................................................... H10K 59/38
See application file for complete search history.

(56) References Cited

U.S. PATENT DOCUMENTS

2023/0120937 A1* 4/2023 Hong .................. H10K 59/122 257/40

FOREIGN PATENT DOCUMENTS

| | | |
|---|---|---|
| CN | 105118928 B | 2/2018 |
| JP | 2010518454 | 5/2010 |
| KR | 1020200075950 | 6/2020 |
| KR | 1020200084967 | 7/2020 |
| KR | 102401878 | 5/2022 |

* cited by examiner

*Primary Examiner* — Anne M Hines

(74) *Attorney, Agent, or Firm* — CANTOR COLBURN LLP

(57) ABSTRACT

A display device includes a plurality of pixels including a first pixel representing green, where each of the pixels includes a light emitting element including an anode, a light emitting layer, and a cathode. The display device further includes a control layer disposed in a direction in which the light emitting element emits light and overlapping the first pixel, and a transmittance of the control layer at a first wavelength band, within a green wavelength band, is lower than a transmittance at a remaining visible light region such that a decrease in a front luminance spectrum by the control layer is greater than a decrease in a side luminance spectrum by the control layer.

20 Claims, 18 Drawing Sheets

DISPLAY DEVICE

This application claims priority to Korean Patent Application No. 10-2022-0149459, filed on Nov. 10, 2022, and all the benefits accruing therefrom under 35 U.S.C. § 119, the content of which in its entirety is herein incorporated by reference.

BACKGROUND

(a) Field

Embodiments of the disclosure relate to a display device.

(b) Description of the Related Art

A display device is a device that displays an image, and a light emitting diode display has recently been developed as a self-emissive display device.

The display device may include a plurality of pixels, and each pixel may include a plurality of transistors and a light emitting element. The transistors may be connected to signal lines, and may transfer a driving current to the light emitting element. The light emitting element may include an anode and a cathode, and the anode may be connected to a transistor of a pixel to receive a driving current. The light emitting element may be implemented as a light emitting diode, in which holes from the anode and electrons from the cathode meet in an emissive layer to emit light.

Light generated in the emission layer may cause constructive interference through reflection at various interfaces inside the light emitting element, and resulting resonance may increase light efficiency.

The pixels include pixels representing basic or primary colors such as red, green, and blue.

SUMMARY

In a light spectrum depending on resonance of a light emitting diode, a peak at a side of a display device and a peak at a front of the display device are different from each other, and accordingly, a difference in luminance may occur at a front and side of an image. Embodiments are directed to a display device having a side luminance ratio with respect to a front of a display device is increased.

An embodiment of the invention provides a display device including a plurality of pixels including a first pixel representing green, where each of the plurality of pixels includes a light emitting element including an anode, a light emitting layer, and a cathode, the display device further includes a control layer disposed in a direction in which the light emitting element emits light and overlapping the first pixel, and a transmittance of the control layer at a first wavelength band, within a green wavelength band, is lower than a transmittance at a remaining visible light region such that a decrease in a front luminance spectrum by the control layer is greater than a decrease in a side luminance spectrum by the control layer.

An embodiment of the invention provides a display device including: a substrate on which a plurality of pixels is defined; a plurality of transistors positioned on the substrate; a plurality of light emitting elements positioned on the transistors; and a control layer disposed on the light emitting elements, where a transmittance of the control layer at a first wavelength band, within a wavelength band of a first color, is lower than a transmittance at a remaining visible light region such that a decrease in a front luminance spectrum by the control layer is greater than a decrease in a side luminance spectrum by the control layer.

In an embodiment, the first wavelength band may be greater than a peak of a Y spectrum of light emitted from a pixel representing the first color, where the Y spectrum reflects luminance among three stimulus values of an XYZ color system.

In an embodiment, the first wavelength band may be about 600 nanometers (nm) or less.

In an embodiment, the first wavelength band may be about 550 nm or greater.

In an embodiment, the transmittance of the control layer at the first wavelength band may be greater than or equal to 0 and less than 1.

In an embodiment, light emitted from the light emitting elements may be resonated and emitted to an outside through the control layer.

In an embodiment, the display device may further include a plurality of color filters positioned corresponding to each of the pixels, and the control layer may be positioned on a first color filter corresponding to the first pixel.

In an embodiment, the display device may further include a color conversion layer or a transmission layer disposed between the light emitting element and the color filters, and the color conversion layer may include a semiconductor nanocrystal which converts light emitted from the light emitting elements.

In an embodiment, the light emitting layer may include a light emitting material which emits blue light.

In an embodiment, the pixels may further include a second pixel representing a different color from the first pixel, and the control layer may include a portion overlapping the second pixel.

An embodiment of the invention provides a display device including a plurality of pixels including a first pixel representing green, where each of the plurality of pixels includes a light emitting element including an anode, a light emitting layer, and a cathode, the display device further includes a control layer disposed in a direction in which the light emitting element emits light and overlapping the first pixel, and a transmittance spectrum of the control layer has a peak closer to a peak of a luminance spectrum of a green color displayed by the first pixel at a side than a peak of a luminance spectrum of the green color displayed by the first pixel at a front.

According to embodiments, it is possible to increase a side luminance ratio which is a ratio of a side luminance with respect to a front luminance of a display device.

DETAILED DESCRIPTION

Figure 1:
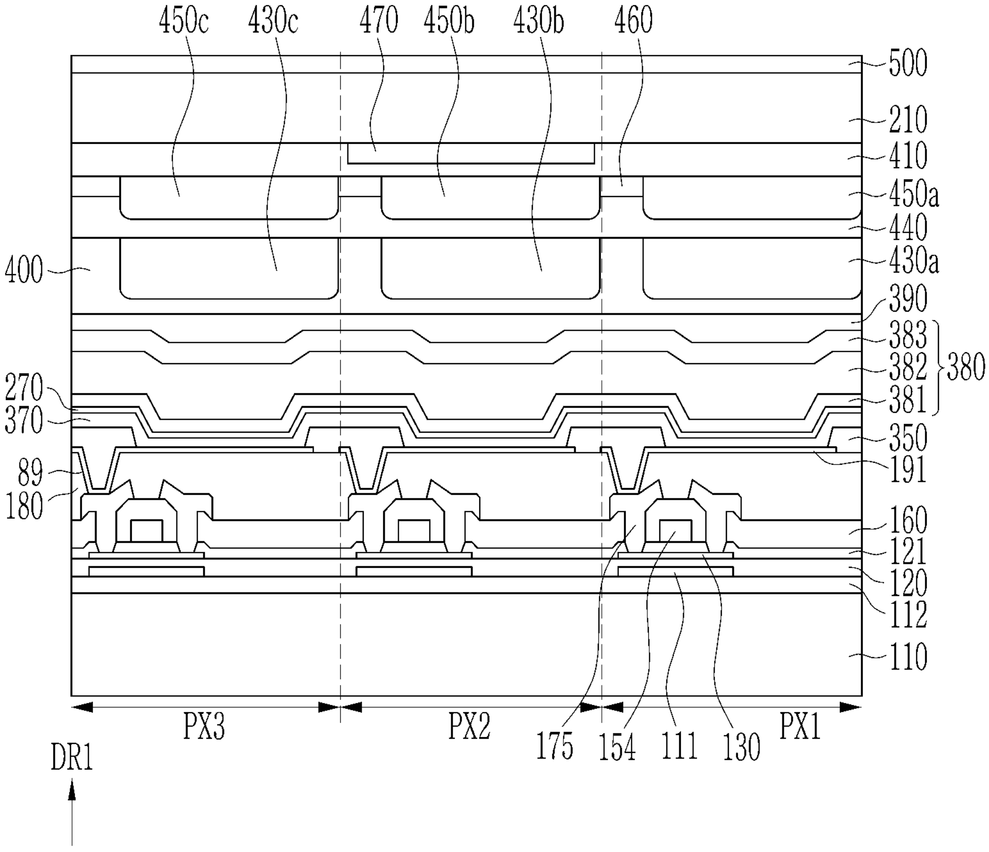
FIG. 1, FIG. 2, and FIG. 3 each illustrate a cross-sectional view of a display device according to an embodiment.

The invention now will be described more fully hereinafter with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Further, since sizes and thicknesses of constituent members shown in the accompanying drawings are arbitrarily given for better understanding and ease of description, the invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, throughout the specification, the phrase "in a plan view" means when an object portion is viewed from above, and the phrase "in a cross-sectional view" means when a cross-section taken by vertically cutting an object portion is viewed from the side.

In addition, throughout the specification, constituent elements positioned on a same conductive layer may include a same material, and constituent elements positioned on a same insulating layer may include a same material.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

First, a display device according to an embodiment will now be described with reference to FIG. 1.

FIG. 1 illustrates a cross-sectional view of a display device according to an embodiment.

Referring to FIG. 1, the display device according to an embodiment includes a plurality of pixels PX1, PX2, and PX3. The pixels PX1, PX2, and PX3 may be units for displaying an image. The pixels PX1, PX2, and PX3 illustrated in FIG. 1 may represent different primary colors, respectively. In an embodiment, for example, the first pixel PX1 may represent red, the second pixel PX2 may represent green, and the third pixel PX3 may represent blue, but basic or primary colors represented by the pixels PX1, PX2, and PX3 are not limited thereto.

The display device according to an embodiment includes a substrate 110. The substrate SUB may include an insulating material such as glass, plastic, or the like, and may have flexibility.

A barrier layer 112 including an insulating material may be disposed on the substrate 110, and a first conductive layer including a lower pattern 111 may be disposed thereon. The lower pattern 111 may be positioned in each of the pixels PX1, PX2, and PX3.

A buffer layer 120, which is an insulating layer, is disposed on the first conductive layer to cover the lower pattern 111, and an active layer 130 may be disposed thereon. The active layer 130 may include a channel region forming a channel of a transistor and a conductive region connected thereto. The active layer 130 may include a semiconductor material such as amorphous silicon, polysilicon, or an oxide semiconductor.

A first insulating layer 121 may be disposed on the active layer 130. The first insulating layer 121 may be formed entirely on the substrate 110, and may have a form with a portion removed or may be patterned in a form that is aligned with a channel region.

A second conductive layer including a gate electrode 154 may be disposed on the first insulating layer 121. The second conductive layer may further include a plurality of scan lines. Each gate electrode 154 may overlap a channel region of an active layer positioned in each of the pixels PX1, PX2, and PX3.

A second insulating layer 160 may be disposed on the second conductive layer.

A third conductive layer including a conductor 175 may be disposed on the second insulating layer 160. The third conductive layer may further include signal lines such as a plurality of data lines, a driving voltage line, and a common voltage line. The conductor 175 may be electrically connected to a conductive region of the active layer 130 through contact holes defined through the first insulating layer 121 and the second insulating layer 160.

At least one selected from the first conductive layer, the second conductive layer, and the third conductive layer may include at least one selected from copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof. Each of the first conductive layer, the second conductive layer, and the third conductive layer may be defined by (or formed as) a single layer or a multilayer structure. In an embodiment, for example, the third conductive layer may have a multilayer structure including a lower layer including titanium and an upper layer including copper.

A third insulating layer 180 may be disposed on the third conductive layer.

A pixel electrode layer including a plurality of pixel electrodes 191 may be disposed on the third insulating layer 180. The pixel electrodes 191 may be electrically connected to the conductor 175 through a contact hole 89 defined through the third insulating layer 180. The pixel electrode layer may include a transflective conductive material or a reflective conductive material.

A sixth insulating layer 350 may be positioned on the third insulating layer 180 and the pixel electrodes 191, and an emission layer (also referred to as "light emitting layer") 370 and a common electrode 270 may be sequentially positioned on the pixel electrodes 191 and the sixth insulating layer 350. According to an embodiment, the emission layer 370 may include a light emitting material that emits light of a first color, which may be blue light.

The common electrode 270 may include a transmissive conductive material. Light generated from the emission layer 370 may reciprocate and resonate between the pixel electrode 191 and the common electrode 270 or between adjacent layers, and then may pass through the common electrode 270 to be emitted to the outside. Through this resonance, constructive interference may occur, and emission efficiency may be increased.

The pixel electrode 191, the emission layer 370, and the common electrode 270 together form (or collectively define) the light emitting diode LED which is the light emitting element, and one of the pixel electrode 191 and the common electrode 270 serves as a cathode and the other of the pixel electrode 191 and the common electrode 270 serves as an anode. The light emitting element may emit light toward an upper surface of the substrate 110, that is, toward a first direction DR1 in FIG. 1.

A plurality of insulating layers 381, 382, and 383 may be stacked on the common electrode 270. The insulating layer 381 and the insulating layer 383 may include an inorganic insulating material, and the insulating layer 382 disposed between the insulating layer 381 and the insulating layer 383 may include an organic insulating material. The insulating layers 381, 382, and 383 may perform a sealing function capable of sealing the light emitting diode and layers therebelow.

A filling layer 390 including a filler may be disposed on the insulating layers 381, 382, and 383. A cover layer 400 including an insulating material, and a plurality of color conversion layers 430*a* and 430*b*, and a transmission layer 430*c* may be disposed on the filling layer 390.

The transmission layer 430*c* may transmit incident light. That is, the transmission layer 430*c* may transmit first color light, which may be blue light. The transmission layer 430*c* may include a polymer material that transmits the first color light. An area where the transmission layer 430*c* is positioned may correspond to an emission area that emits blue light, and the transmission layer 430*c* may not include a separate semiconductor nanocrystal and may pass incident first color light as it is.

The color conversion layers 430*a* and 430*b* may include different semiconductor nanocrystals from each other. In an embodiment, for example, light of the first color incident to the color conversion layer 430*a* may be converted into light of a second color by semiconductor nanocrystals included in the color conversion layer 430*b* to be emitted. Light of the first color incident to the color conversion layer 430*b* may be converted into light of a third color by semiconductor nanocrystals included in the color conversion layer 430*b* to be emitted.

The semiconductor nanocrystals may include at least one selected from a phosphor and a quantum dot material that converts incident light of the first color into light of the second color or light of a third color. A core of the quantum dot may include at least one selected from a group II-VI compound, a group III-V compound, a group IV-VI compound, a group IV element, a group IV compound, and a combination thereof.

An insulating layer 440 may be positioned on the color conversion layers 430*a* and 430*b* and the transmission layer 430*c*, and a plurality of color filters 450*a*, 450*b*, and 450*c* and a light blocking member 460 may be positioned thereon. The color filter 450*a* may represent the second color, the color filter 450*b* may represent the third color, and the color filter 450*c* may represent the first color. The light blocking member 460 may be positioned between adjacent color filters 450*a*, 450*b*, and 450*c*.

The control layer 470 is positioned on the color filters 450*a*, 450*b*, and 450*c* and the light blocking member 460. Light emitted from the light emitting layer 370 and resonating and then emitted toward the first direction DR1 may pass through the control layer 470 to be emitted to the outside.

In an embodiment, the control layer 470 may increase a ratio of luminance at a side to luminance at a front of an image displayed by the display device. In such an embodiment, the control layer 470 may be implemented as a color filter including a dye capable of lowering transmittance of a specific wavelength band (referred to as a control wavelength band) of visible light. In such an embodiment, the control layer 470 may effectively increase a luminance ratio at the side to the front by lowering transmittance of the control wavelength band, which is a wavelength band of a specific area of a green wavelength band, which is the basic color that has a greatest influence on the luminance of the image among several basic colors.

In a case where light from a light emitting diode of a display device is emitted to an outside through resonance, a luminance spectrum at a side may have a blue shift, that is, a peak shift toward a lower wavelength, compared to the luminance spectrum at a front due to a difference in optical path. According to an embodiment of the invention, the control layer 470 may lower the transmittance of the control wavelength band, in which the front luminance spectrum is lowered more than the side luminance spectrum, among the green wavelength bands. In an embodiment, the control wavelength band at which the control layer 470 lowers the transmittance may include a wavelength band region higher (or greater) than a peak of an Y spectrum that reflects luminance among three stimulus values of an XYZ color system to minimize luminance loss.

In an embodiment, for example, the control layer 470 may lower the transmittance of only the control wavelength band of a specific region between about 550 nanometers (nm) and about 600 nm in a visible ray region.

In an embodiment, the control layer 470 may be disposed only on a pixel representing a specific color, e.g., the second pixel PX2, and may not be positioned on pixels that display other colors. In such an embodiment, the color represented by the second pixel PX2 may be green.

Features of the control layer 470 will be described later in greater detail.

A substrate 210 may be positioned on the control layer 470. An insulating layer 410 may be disposed between the substrate 210 and the control layer 470. Alternatively, the insulating layer 410 may be omitted.

A polarizer 500 may be positioned above or below the substrate 210. The polarizer 500 may reduce reflection of external light incident from the outside of an upper portion of the display device. Transmittance of the polarizer 500 may be in a range of about 0.2 to about 0.6, but the disclosure is not limited thereto.

Next, a display device according to an embodiment will now be described with reference to FIG. 2.

Figure 2:
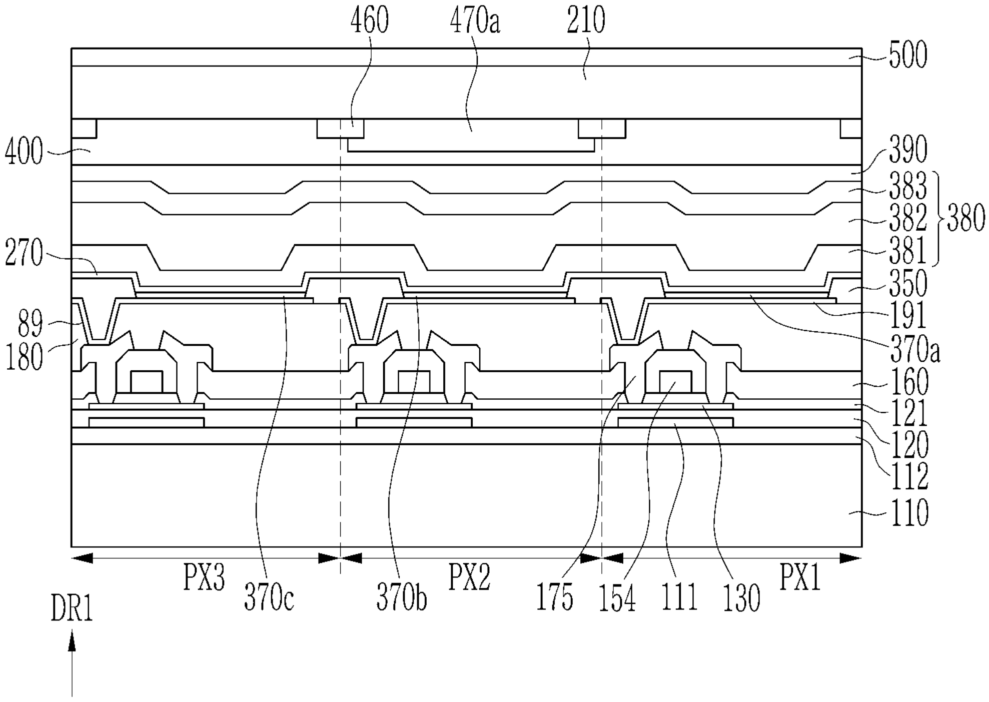

FIG. 2 illustrates a cross-sectional view of a display device according to an embodiment.

The embodiment of a display device shown in FIG. 2 is substantially the same as the embodiment of the display device described above with reference to FIG. 1, except for a partial stacked structure thereof. Herein, different features of the embodiment of a display device shown in FIG. 2 from the embodiment described above will be mainly described.

In an embodiment shown in FIG. 2, the third insulating layer 180 on the substrate 110 to the sixth insulating layer 350 on the pixel electrode 191 may be positioned as described above with reference to FIG. 1, and a plurality of emission layers 370*a*, 370*b*, and 370*c* corresponding to the respective pixels PX1, PX2, and PX3 and the common electrode 270 may be sequentially positioned on the pixel electrode 191 and the sixth insulating layer 350. Each of the emission layers 370*a*, 370*b*, and 370*c* may include a light emitting material that emits light of the color of the corresponding pixels PX1, PX2, and PX3. Each of the emission layers 370*a*, 370*b*, and 370*c* may be positioned in an area defined by an opening of the sixth insulating layer 350 to define an emission area of each pixel PX1, PX2, and PX3.

The common electrode 270 may be formed on an entire surface of the substrate 110.

The insulating layers 381, 382, and 383, the filling layer 390, and the cover layer 400 may be sequentially disposed on the common electrode 270, and the light blocking member 460 and a control layer 470*a* may be positioned thereon. The light blocking member 460 may be positioned between adjacent emission layers 370*a*, 370*b*, and 370*c*. The control layer 470*a* may be the same as the control layer 470 described above.

A substrate 210 may be positioned on the control layer 470.

Next, a display device according to an embodiment will now be described with reference to FIG. 3.

Figure 3:
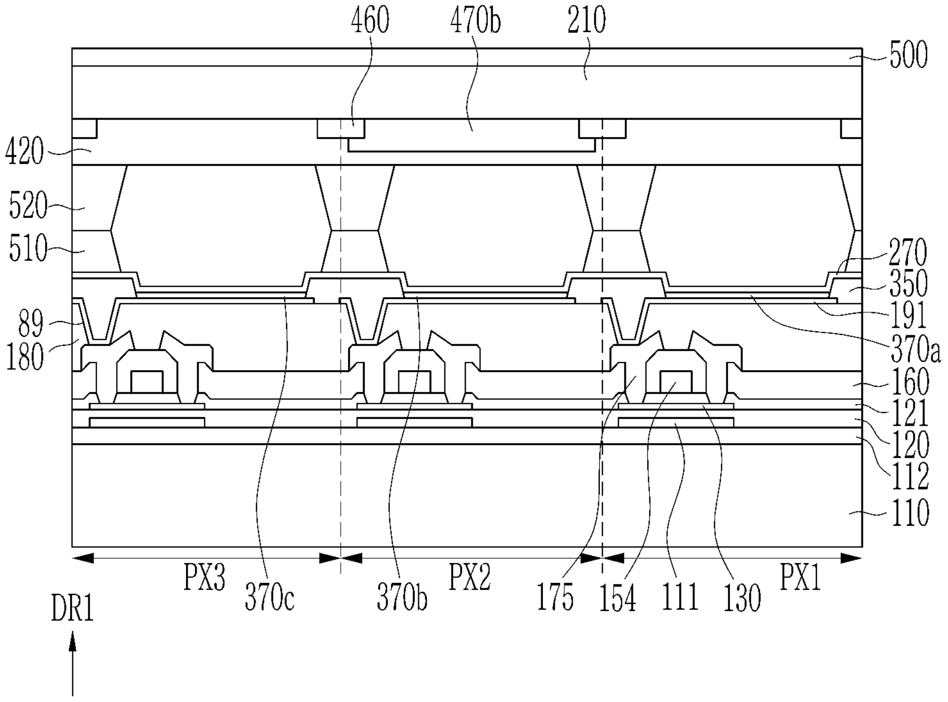

FIG. 3 illustrates a cross-sectional view of a display device according to an embodiment.

The embodiment of a display device shown in FIG. 3 is substantially the same as embodiments of the display device described above with reference to FIG. 1 or FIG. 2, except for a partial stacked structure therein. Herein, different features of the embodiment of a display device shown in FIG. 3 from the embodiments described above will be mainly described.

In an embodiment, as described above, the common electrode 270 and the layers therebelow may be positioned on the substrate 110.

The light blocking member 460 and a control layer 470*b* may be positioned on a lower surface of another substrate 210 facing the substrate 110. The light blocking member 460 may be positioned between adjacent pixel PX1, PX2, and PX3. The control layer 470*b* may be the same as the control layers 470 and 470*a* described above.

An insulating layer 420 may be positioned under the control layer 470*b*.

A plurality of spacers may be positioned between the two facing substrates 110 and 210 to maintain a distance between the two substrates 110 and 210. The spacer may include a lower spacer 510 formed on the substrate 110 and an upper spacer 520 formed at a lower portion of the substrate 210. The lower spacer 510 and the upper spacer 520 corresponding to each other may face and support each other. Alternatively, at least one selected from the lower spacer 510 and the upper spacer 520 may be omitted.

In addition, a structure of the display device may be variously changed or modified.

Next, characteristics of a display device including a control layer according to an embodiment will be described with reference to FIG. 4 to FIG. 6 along with FIG. 1 to FIG. 3.

Figure 4:
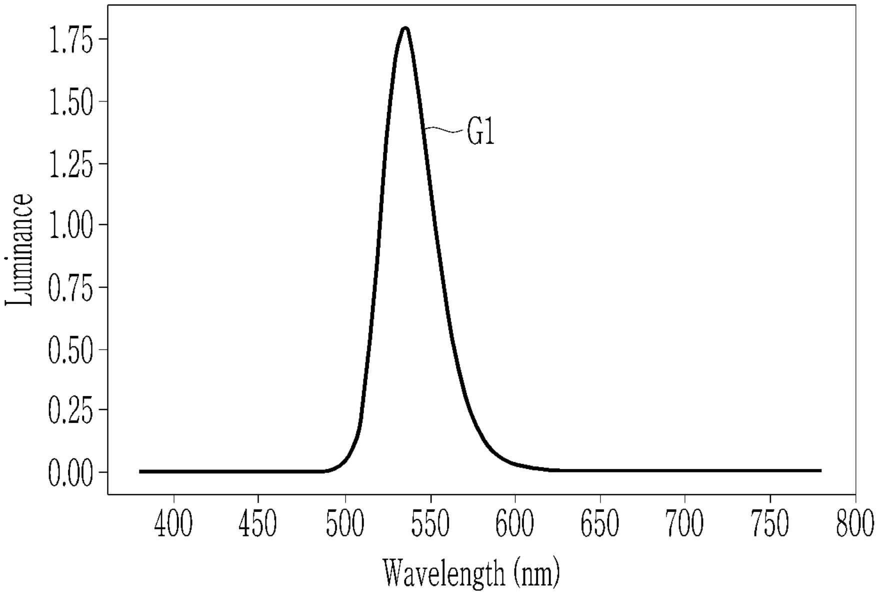
FIG. 4 illustrates a luminance spectrum at a front and a side of one pixel of a display device according to a comparative embodiment.
Figure 4:
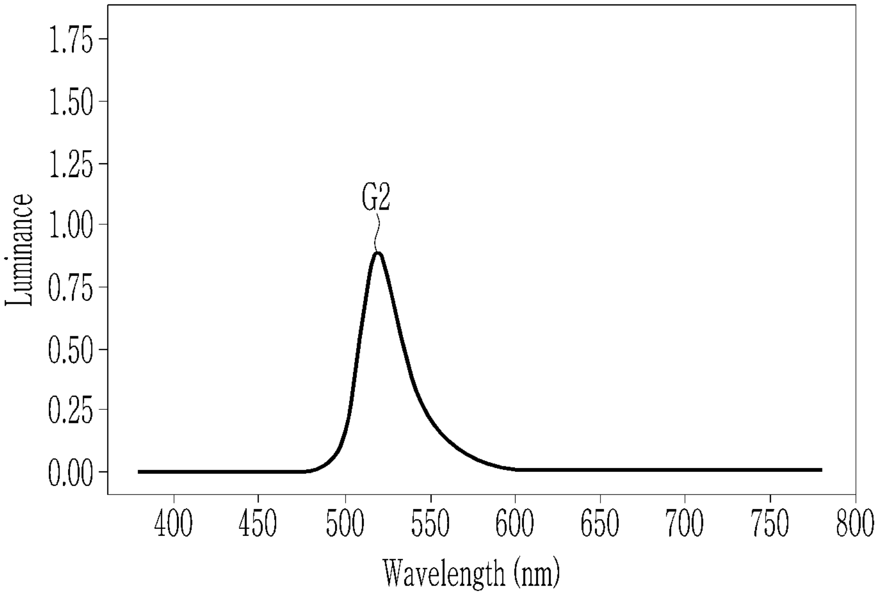

FIG. 4 illustrates a luminance spectrum at a front and a side of one pixel of a display device according to a comparative embodiment. In particular, FIG. 4 illustrates luminance spectra at a front and a side of a pixel displaying green, which is a basic color of a wavelength band having a greatest influence on luminance of an image among various basic colors, as an example. Hereafter, in the present description, when describing the luminance at the side, the luminance at the side viewed at an angle of approximately 45 degrees from the front direction has been described as an example.

A display device according to the comparative embodiment is substantially the same as the display device according to the embodiment described above, except that the display device according to the comparative embodiment does not include the control layers 470, 470*a*, and 470*b*.

As described above, when light is emitted through resonance from the light emitting diodes of the display devices according to the comparative example and the example, a peak of a luminance spectrum G2 at the side may be shifted toward a lower wavelength compared from a luminance spectrum G1 at the front of the green pixel due to a difference in optical path, and the luminance at the peak may also be lowered. Even in the case of the red pixel and the blue pixel, the peak shifts toward a wavelength in which the luminance spectrum at the side is lower than the luminance spectrum at the front in each wavelength band, and the luminance at the peak may also be lowered. Referring to FIG. 4, it can be seen that the peak of the luminance spectrum G1 at the front is positioned at approximately 540 nm, and the peak of the luminance spectrum G2 at the side is positioned at approximately 520 nm. Accordingly, in the case of the display device according to the comparative example, a ratio of luminance at a side of a white image to luminance at a front (hereinafter, referred to as a side luminance ratio) is considerably lowered. In the case of the display device according to the comparative example, the side luminance ratio may drop to about 45.2%.

Figure 5:
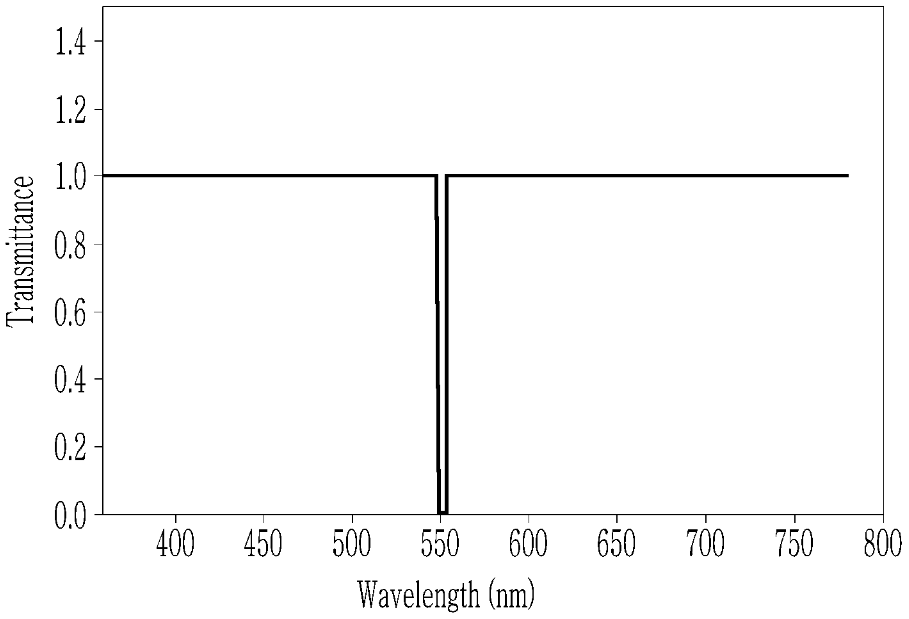
FIG. 5 illustrates a graph showing transmittance depending on a wavelength of a control layer according to an embodiment.
Figure 6:
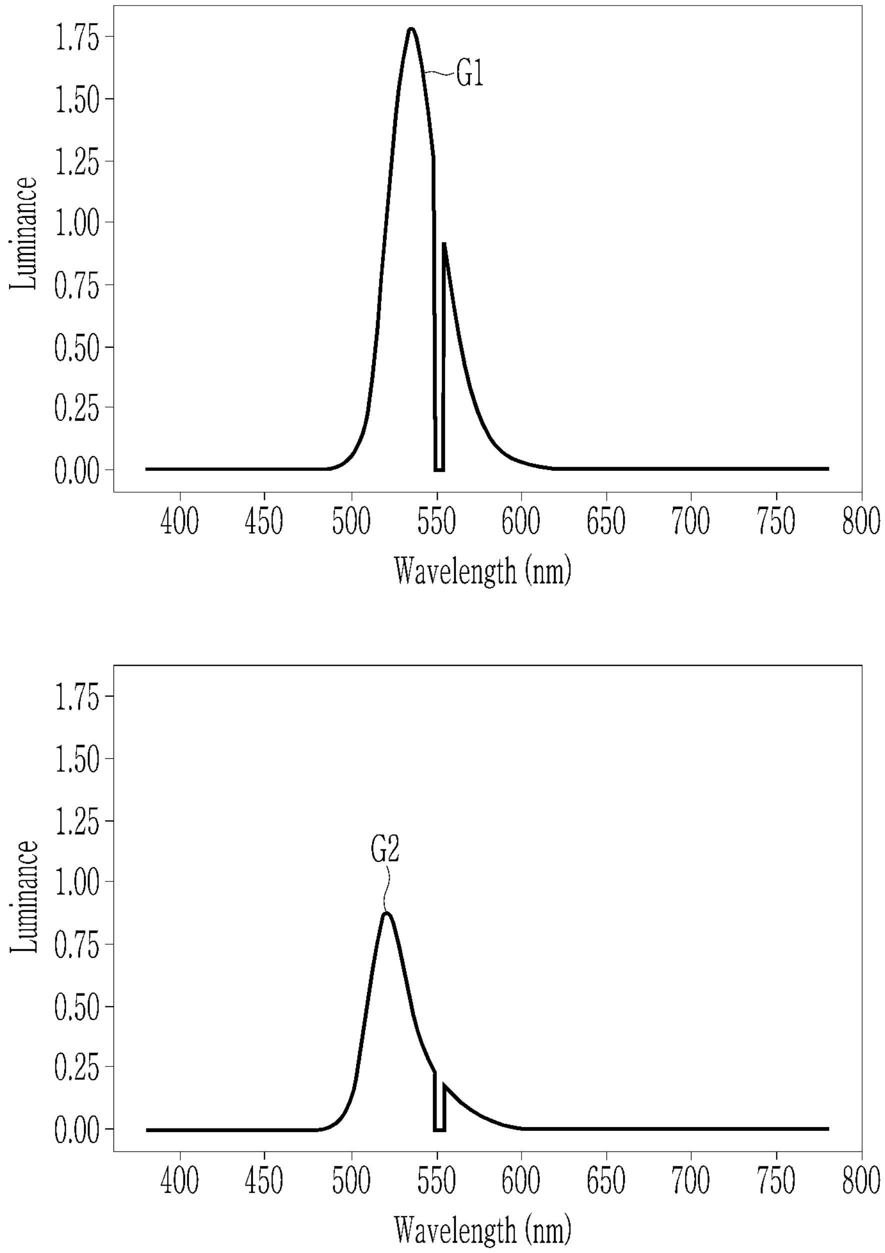
FIG. 6 illustrates a luminance spectrum at a front and a side of a display device according to an embodiment.

FIG. 5 illustrates a graph showing transmittance depending on a wavelength of a control layer according to an embodiment, and FIG. 6 illustrates a luminance spectrum at a front and a side of a display device according to an embodiment.

As described above, the control layers 470, 470*a*, and 470*b* according to an embodiment may lower transmittance of a specific control wavelength band in which the front luminance spectrum is lowered than the side luminance spectrum among the green wavelength bands, and may lower transmittance of only a specific wavelength band between about 550 nm and about 600 nm. FIG. 5 illustrates transmittances of the control layers 470, 470*a*, and 470*b*, having the control transmittance range of almost zero in the wavelength band of about 550 nm to about 555 nm, and transmittance of about 1 in a remaining visible light range according to an embodiment as an example.

FIG. 6 illustrates the front luminance spectrum G1 and a side luminance spectrum G2 displayed by a display device including the control layers 470, 470*a*, and 470*b* as illustrated in FIG. 5. Referring to FIG. 6, it can be seen that the luminance spectrum G1 at the front and the luminance spectrum G2 at the side in a region corresponding to the control wavelength band, which is a wavelength band absorbed by the control layers 470, 470*a*, and 470*b* shown in FIG. 5 have fallen close to 0. A magnitude of deteriorated luminance of the luminance spectrum G1 at the front is considerably greater than that of deteriorated luminance of the luminance spectrum G2 at the side, and thus a difference between the luminance at the front and the luminance at the side is reduced, so that the side luminance ratio (i.e., a ratio of the luminance at the side with respect to the luminance at the front) may be effectively increased.

Various examples of the control layer included in the display device according to an embodiment will now be described with reference to FIG. 7 to FIG. 11 together with the previously described drawings.

Figure 7:
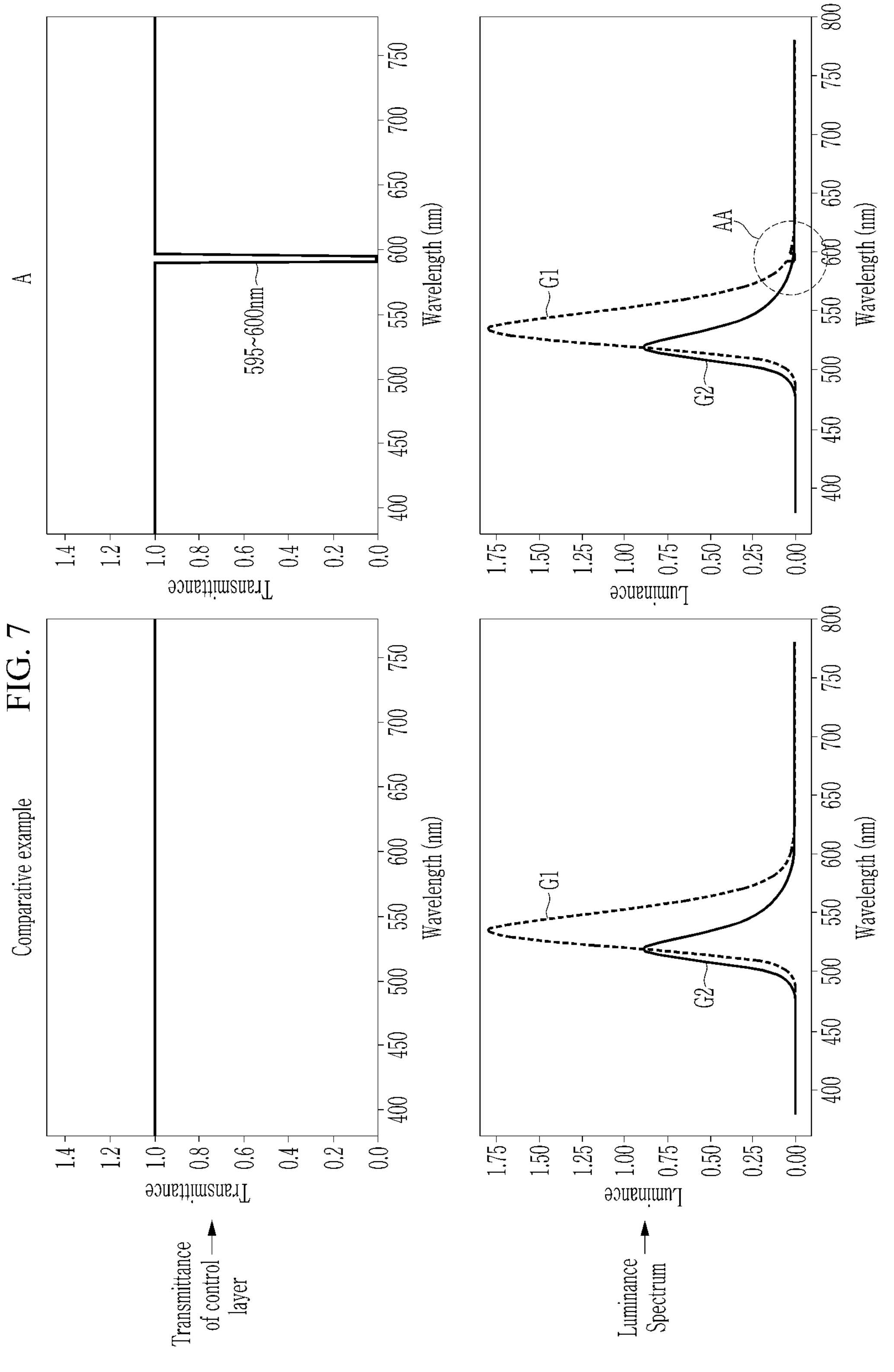
FIG. 7 illustrates transmittance of a control layer of a display device according to a comparative example and a display device according to an example, and graphs showing luminance spectra at a front and a side of the display devices.
Figure 8:
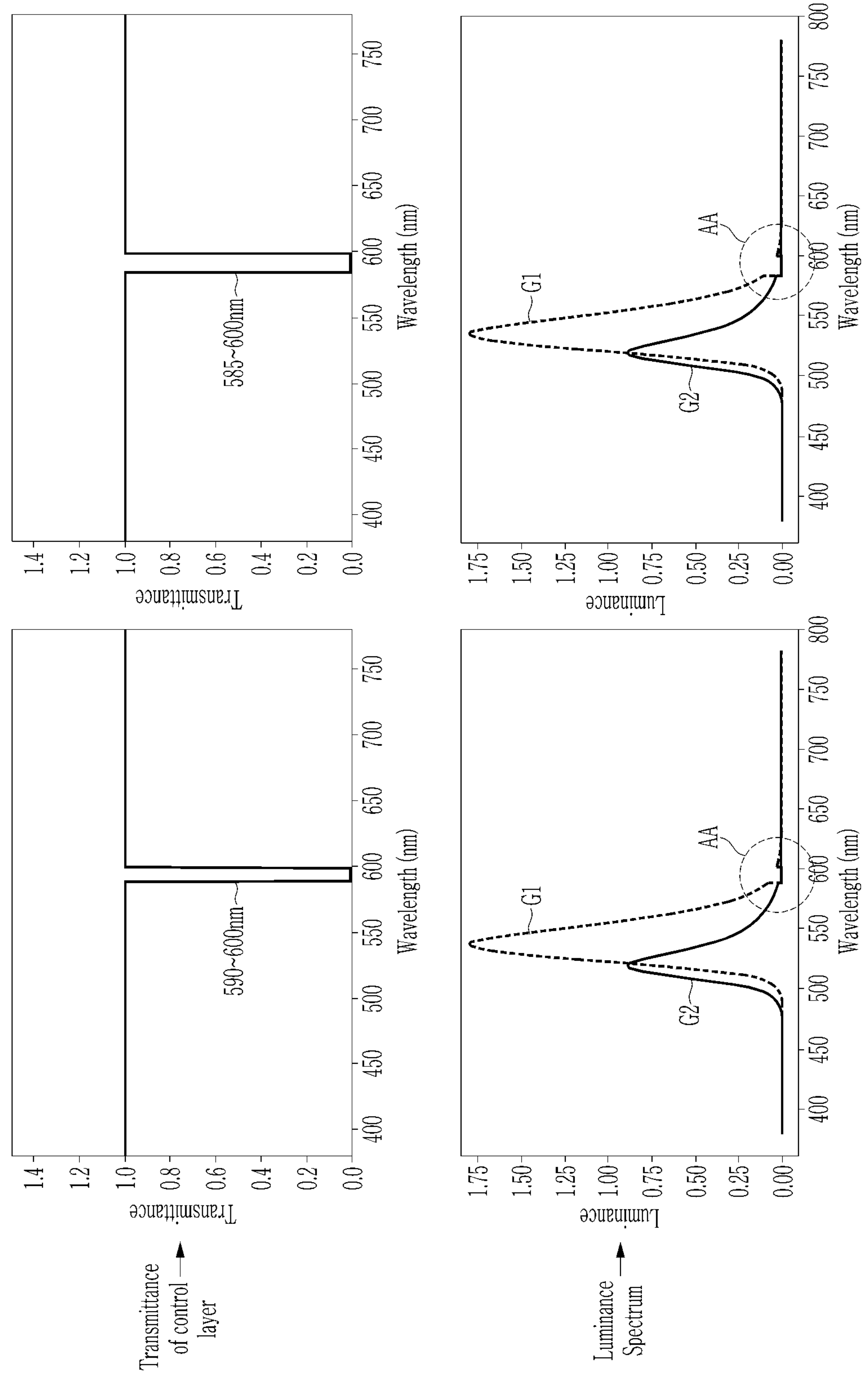
FIG. 8 illustrates graphs showing transmittance of a control layer of a display device according to embodiments and graphs showing luminance spectra at a front and a side of the display device.
Figure 9:
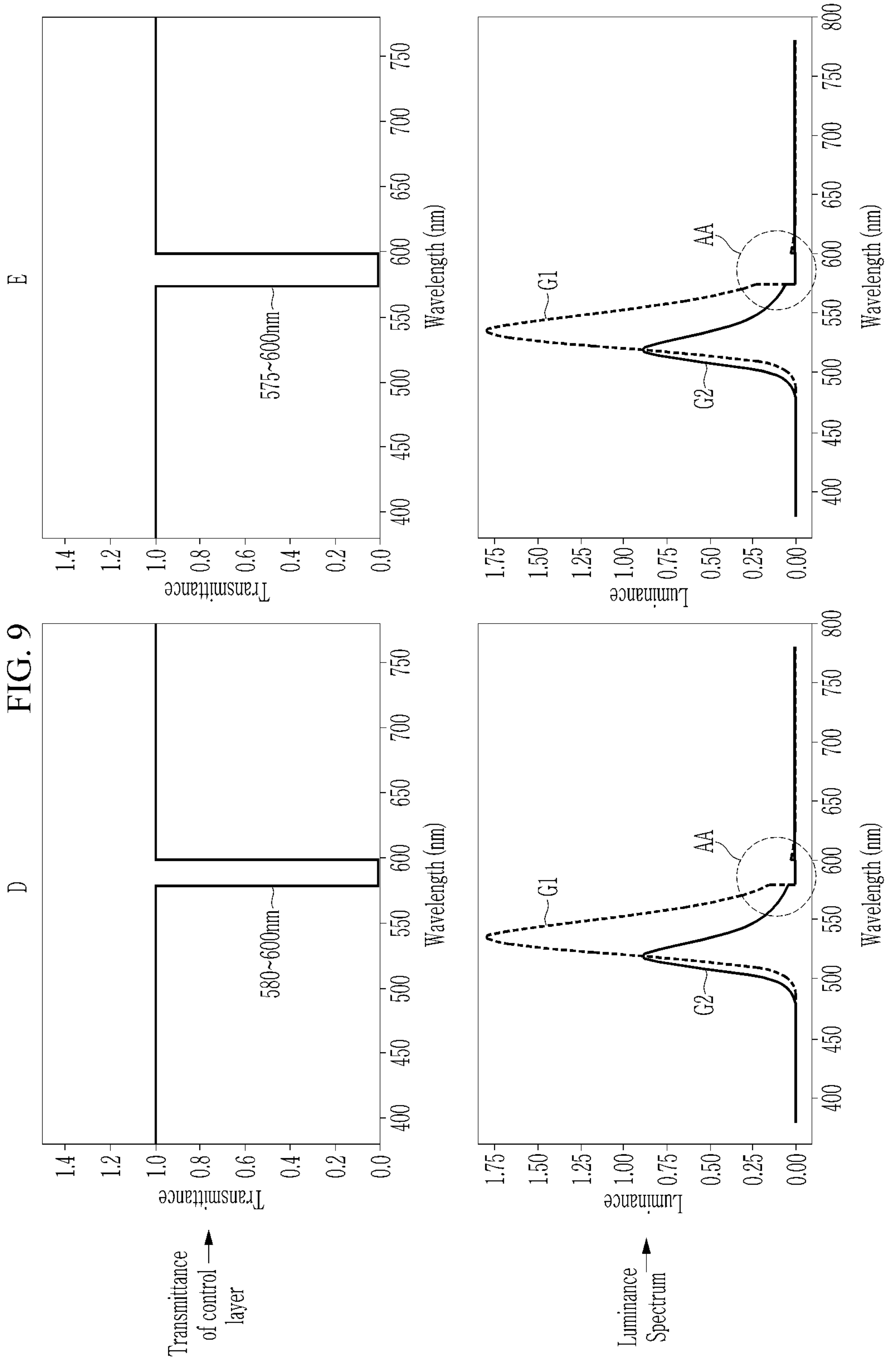
FIG. 9 illustrates graphs showing transmittance of a control layer of a display device according to embodiments and graphs showing luminance spectra at a front and a side of the display device.
Figure 10:
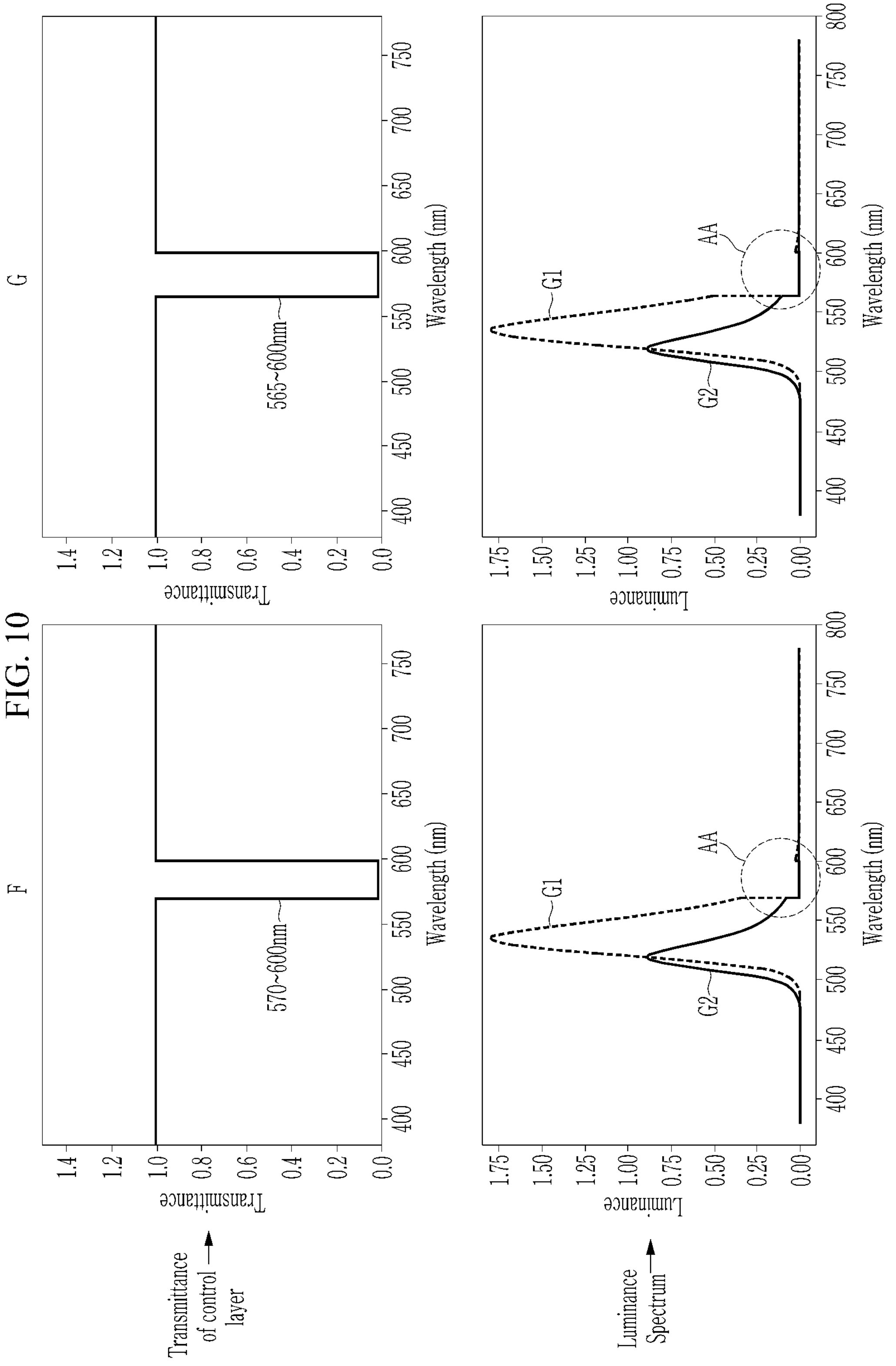
FIG. 10 illustrates graphs showing transmittance of a control layer of a display device according to embodiments and graphs showing luminance spectra at a front and a side of the display device.
Figure 11:
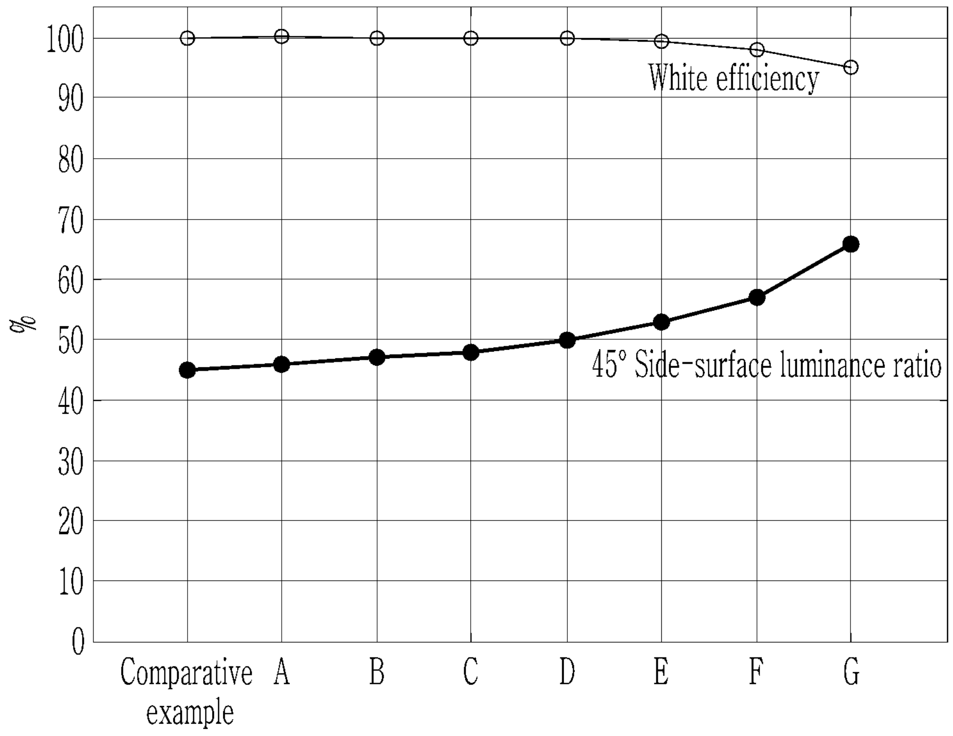
FIG. 11 illustrates a 45-degree side luminance ratio and white efficiency of a display device according to comparative examples and examples.

FIG. 7 illustrates transmittance of a control layer of a display device according to a comparative example and a display device according to an example, and graphs showing luminance spectra at a front and a side of the display devices, FIG. 8 illustrates a graphs showing transmittance of a control layer of a display device according to examples and graphs showing luminance spectra at a front and a side of the display device, FIG. 9 illustrates graphs showing transmittance of a control layer of a display device according to examples and graphs showing luminance spectra at a front and a side of the display device, FIG. 10 illustrates a graphs showing transmittance of a control layer of a display device according to examples and graphs showing luminance spectra at a front and a side of the display device, and FIG. 11 illustrates a 45-degree side luminance ratio and white efficiency of a display device according to comparative examples and examples.

First, referring to FIG. 7 and FIG. 11, two upper and lower graphs at a left side of FIG. 7 indicate comparative examples as shown in FIG. 4 described above, in which the control layer is not included or the transmittance of the control layer is 1 in all visible light regions. In this case, as shown in FIG. 4 described above, luminance of the luminance graph G1 at the front and the luminance graph G2 at the side is not adjusted, and as illustrated in FIG. 11, the side luminance ratio at 45 degrees is approximately 45%.

As described above, to minimize luminance loss while increasing the luminance degradation of the front luminance spectrum compared to the side luminance spectrum, it may be a wavelength range from about 550 nm to about 600 nm, which the control layers 470, 470*a*, and 470*b* lower the transmittance, that is, the control layers 470, 470*a*, and 470*b* absorb. Two graphs at a right side of FIG. 7 to graphs illustrated in FIG. 10 represent various examples. In addition, a case in which the transmittance is approximately 0 (i.e., 0%) in the control wavelength range where the transmittance is lowered by the control layers 470, 470*a*, and 470*b* and the transmittance is approximately 1 (i.e., 100%) in the remaining visible ray region is exemplified, but the disclosure is not limited thereto. Alternatively, for example, the transmittance in the control wavelength band in which the transmittance is lowered by the control layers 470, 470*a*, and 470*b* may be greater than 0 and less than 1, and the transmittance in the remaining visible light region may be higher than the transmittance in the control wavelength band in the remaining visible light region.

An upper graph at a right side of FIG. 7 shows an example (Example A) in which the control wavelength band absorbed by the control layers 470, 470*a*, and 470*b* is approximately 595 nm to approximately 600 nm, and a lower graph shows the luminance graph G1 at the front and the luminance graph G2 at the side according to Example A. As shown in an area indicated by AA in the lower graph of Example A of FIG. 7, it can be seen that the luminance of the luminance spectrum G1 at the front and the luminance spectrum G2 at the side fell close to zero at about 595 nm to about 600 nm. In this case, as illustrated in FIG. 11, the side luminance ratio at 45 degrees may be higher than that of the comparative example, and may be approximately 47%.

An upper graph at a left side of FIG. 8 shows an example (Example B) in which the control wavelength band absorbed by the control layers 470, 470*a*, and 470*b* is approximately 590 nm to approximately 600 nm, and a lower graph shows the luminance graph G1 at the front and the luminance graph G2 at the side according to Example B. As shown in an area indicated by AA in the lower graph of Example B of FIG. 8, it can be seen that the luminance of the luminance spectrum G1 at the front and the luminance spectrum G2 at the side fell close to zero at about 590 nm to about 600 nm. In this case, as illustrated in FIG. 11, the side luminance ratio at 45 degrees may be higher than that of Example A, and may be approximately 48%.

An upper graph at a right side of FIG. 8 shows an example (Example C) in which the control wavelength band absorbed by the control layers 470, 470*a*, and 470*b* is approximately 585 nm to approximately 600 nm, and a lower graph shows the luminance graph G1 at the front and the luminance graph G2 at the side according to Example C. As shown in an area indicated by AA in the lower graph of Example C of FIG. 8, it can be seen that the luminance of the luminance spectrum G1 at the front and the luminance spectrum G2 at the side fell close to zero at about 585 nm to about 600 nm. In this case, as illustrated in FIG. 11, the side luminance ratio at 45 degrees may be higher than that of Example B, and may be approximately 49%.

An upper graph at a left side of FIG. 9 shows an example (Example D) in which the control wavelength band absorbed by the control layers 470, 470*a*, and 470*b* is approximately 580 nm to approximately 600 nm, and a lower graph shows the luminance graph G1 at the front and the luminance graph G2 at the side according to Example D. As shown in an area indicated by AA in the lower graph of Example D of FIG. 9, it can be seen that the luminance of the luminance spectrum G1 at the front and the luminance spectrum G2 at the side fell close to zero at about 580 nm to about 600 nm. In this case, as illustrated in FIG. 11, the side luminance ratio at 45 degrees may be higher than that of Example C, and may be approximately 50%.

An upper graph at a right side of FIG. 9 shows an example (Example E) in which the control wavelength band absorbed by the control layers 470, 470*a*, and 470*b* is approximately 575 nm to approximately 600 nm, and a lower graph shows the luminance graph G1 at the front and the luminance graph G2 at the side according to Example E. As shown in an area indicated by AA in the lower graph of Example E of FIG. 9, it can be seen that the luminance of the luminance spectrum G1 at the front and the luminance spectrum G2 at the side fell close to zero at about 575 nm to about 600 nm. In this case, as illustrated in FIG. 11, the side luminance ratio at 45 degrees may be higher than that of Example D, and may be approximately 53%.

An upper graph at a left side of FIG. 10 shows an example in which the control wavelength band absorbed by the control layers 470, 470*a*, and 470*b* according to Example F is approximately 570 nm to approximately 600 nm, and a lower graph shows the luminance graph G1 at the front and the luminance graph G2 at the side according to Example F. As shown in an area indicated by AA in the lower graph of Example F of FIG. 10, it can be seen that the luminance of the luminance spectrum G1 at the front and the luminance spectrum G2 at the side fell close to zero at about 570 nm to about 600 nm. In this case, as illustrated in FIG. 11, the side luminance ratio at 45 degrees may be higher than that of Example E and may be approximately 58%.

An upper graph at a right side of FIG. 10 shows an example (Example G) in which the control wavelength band absorbed by the control layers 470, 470*a*, and 470*b* is approximately 565 nm to approximately 600 nm, and a lower graph shows the luminance graph G1 at the front and the luminance graph G2 at the side according to Example E. As shown in an area indicated by AA in the lower graph of Example G of FIG. 10, it can be seen that the luminance of the luminance spectrum G1 at the front and the luminance spectrum G2 at the side fell close to zero at about 565 nm to about 600 nm. In this case, as illustrated in FIG. 11, the side luminance ratio at 45 degrees may be higher than that of Example F and may be approximately 66%.

As such, in the case of Example F and Example G, it can be seen that the side luminance ratio is significantly higher than that of the comparative example and the other examples. However, as illustrated in FIG. 11, as the control wavelength band absorbed by the control layers 470, 470*a*, and 470*b* widens, the white light emission efficiency may slightly decrease.

Figure 12:
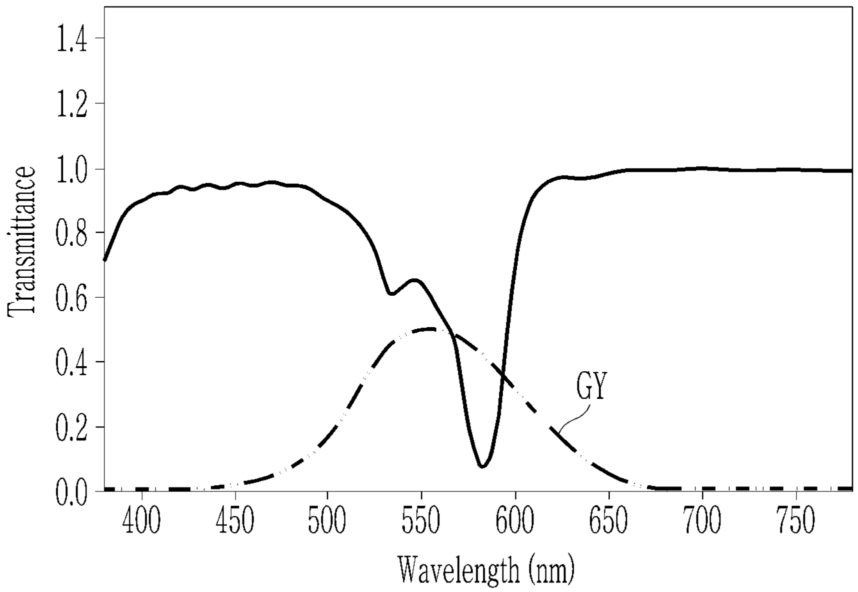
FIG. 12 illustrates a graph showing transmittance of a control layer included in a display device according to an embodiment.
Figure 13:
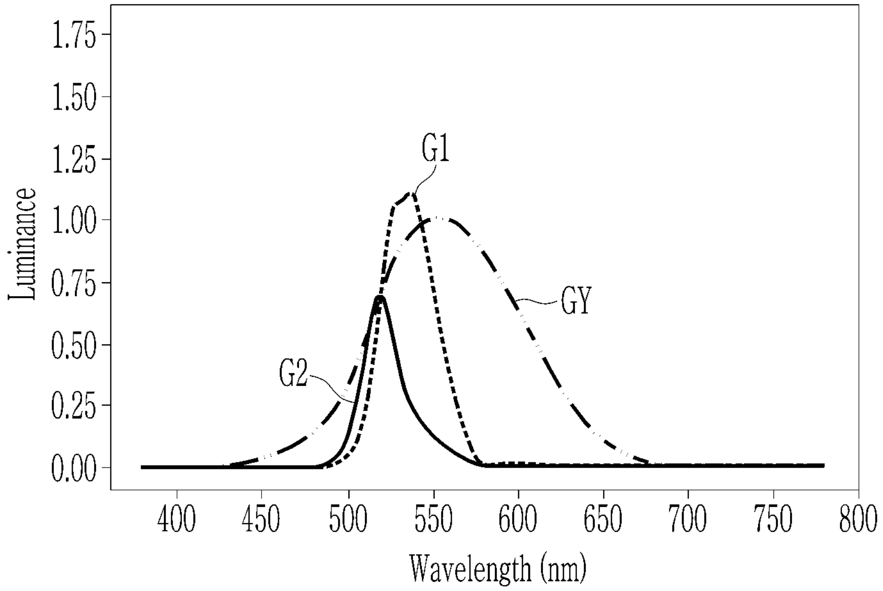
FIG. 13 illustrates a graph showing luminance spectra at a front and a side of a display device including the control layer illustrated in FIG. 12.

FIG. 12 illustrates a graph showing transmittance of a control layer included in a display device according to an embodiment, and FIG. 13 illustrates a graph showing luminance spectra at a front and a side of a display device including the control layer illustrated in FIG. 12.

Referring to FIG. 12, a control wavelength band absorbed by the control layers 470, 470*a*, and 470*b* according to an embodiment may be a wavelength range from about 550 nm to about 600 nm, and a transmittance of 0.6 or greater in the remaining wavelength bands is maintained. Compared with a Y spectrum GY that reflects the luminance among three stimulus values of the XYZ color system illustrated in FIG. 12, the control wavelength band absorbed by the control layers 470, 470*a*, and 470*b* overlaps a region greater than the peak of the Y spectrum GY, and thus luminance loss may be reduced while increasing the side luminance ratio.

Referring to FIG. 13, the luminance spectrum G1 in front of the green color displayed by the display device including the control layers 470, 470*a*, and 470*b* has much lower luminance than the luminance spectrum G1 at the front shown in the comparative example of FIG. 4 or FIG. 7 described above, but luminance of a portion corresponding to the right side wavelength band based on the peak of the Y spectrum GY was mainly lowered, and the luminance of the luminance spectrum G2 at the side did not change significantly. That is, it can be seen that an area ratio of the luminance spectrum G2 at the side to the luminance spectrum G1 at the front of a green color displayed by the display device including the control layers 470, 470*a*, and 470*b*, that is, the side luminance ratio is improved.

Next, a display device including a control layer according to an embodiment will be described with reference to FIG. 14 along with the previously described drawings.

Figure 14:
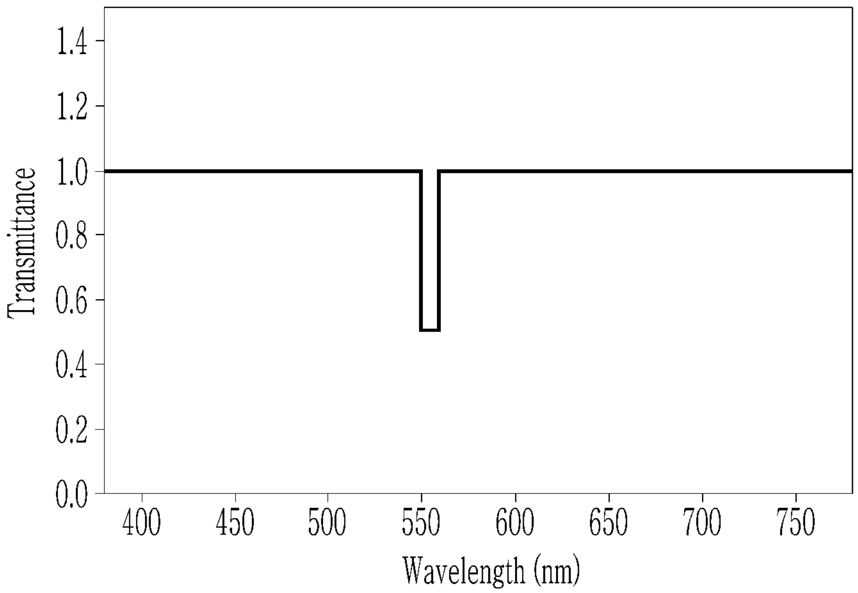
FIG. 14 illustrates a graph showing transmittance of a control layer of a display device according to an embodiment.

FIG. 14 illustrates a graph showing transmittance of a control layer of a display device according to an embodiment.

The embodiment of the control layer 470, 470*a*, or 470*b* shown in FIG. 14 is substantially the same as the control layers according to the embodiments described above, except that the control layer 470, 470*a*, or 470*b* has transmittance of a non-zero value, e.g., approximately 0.5, in the control wavelength band absorbed by the control layer 470, 470*a*, or 470*b*, and transmittance of about 1 in the remaining visible light region. The transmittance of the control wavelength band absorbed by the control layer 470, 470*a*, or 470*b* is not limited thereto, and may vary between 0 and 1 depending on conditions such as a thickness and a material of the control layer 470, 470*a*, or 470*b*.

Next, a display device including a control layer according to an embodiment will be described with reference to FIG. 15 along with the previously described drawings.

Figure 15:
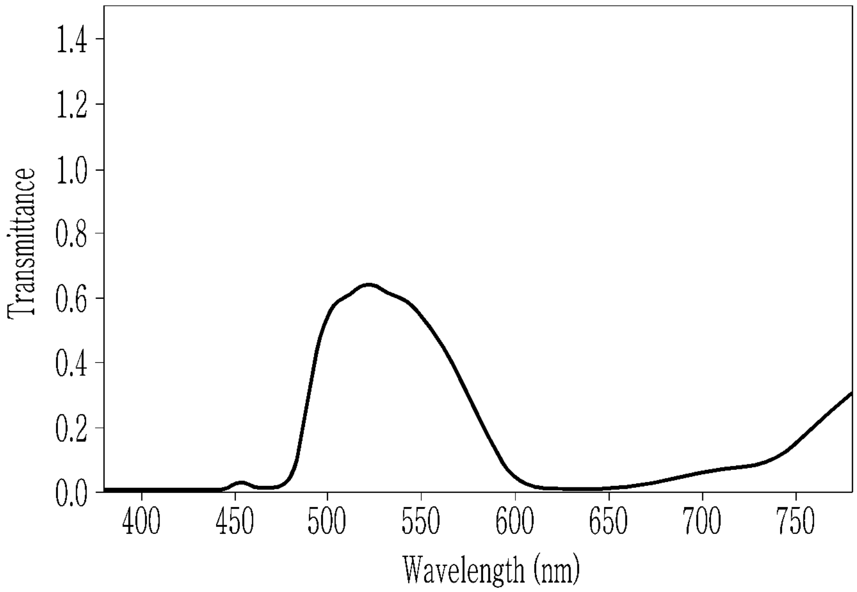
FIG. 15 illustrates a graph showing transmittance of a control layer of a display device according to an embodiment, and FIG. 16, FIG. 17, and FIG. 18 each illustrate a cross-sectional view of a display device according to an embodiment.

FIG. 15 illustrates a graph showing transmittance of a control layer of a display device according to an embodiment.

The embodiment of the control layer 470, 470*a*, or 470*b* shown in FIG. 15 may have high transmittance only in the green wavelength range of the visible ray region, and the transmittance may be 0 or close to 0 in the other regions, unlike in the embodiments described above. A peak of the transmittance graph shown in FIG. 15 may be closer to the peak of the luminance spectrum G2 at the side than the peak of the luminance spectrum G1 at the front shown in the comparative embodiment of FIG. 4 or FIG. 7 described above.

The control layer 470, 470*a*, or 470*b* may function substantially like a green color filter, and may be patterned and formed only on the green pixel.

Next, a display device according to an embodiment will described with reference to FIG. 16, FIG. 17, and FIG. 18 together with the aforementioned drawings.

Figure 16:
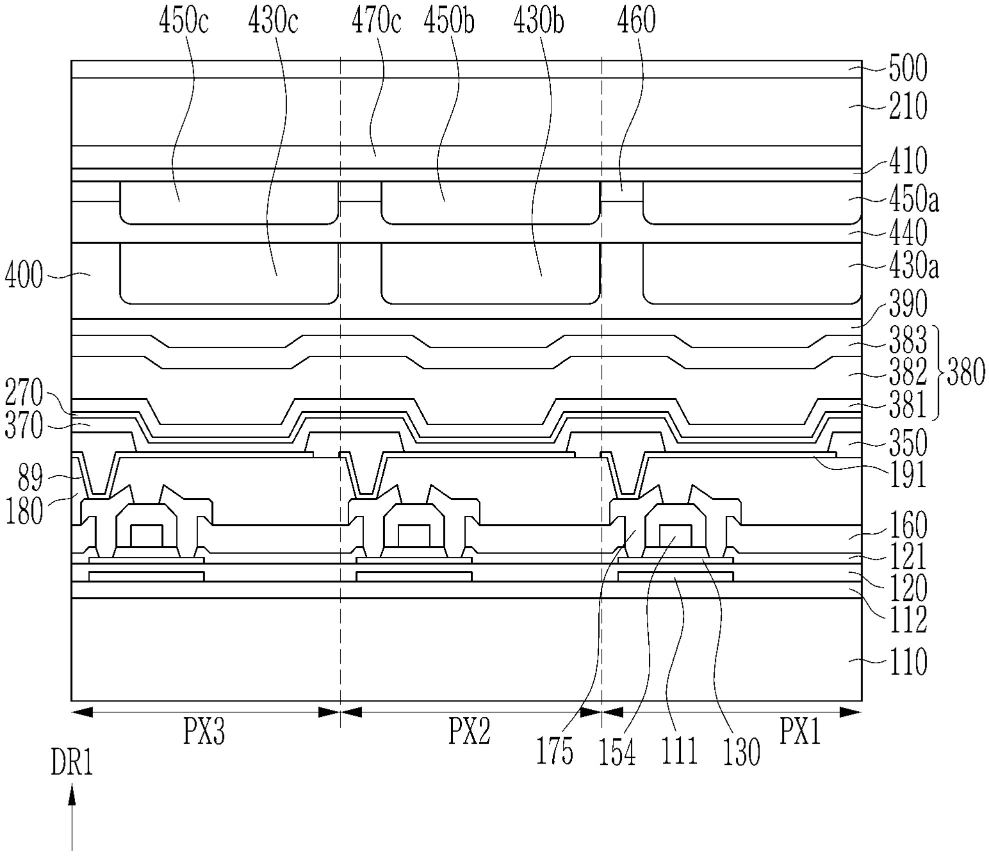
Figure 17:
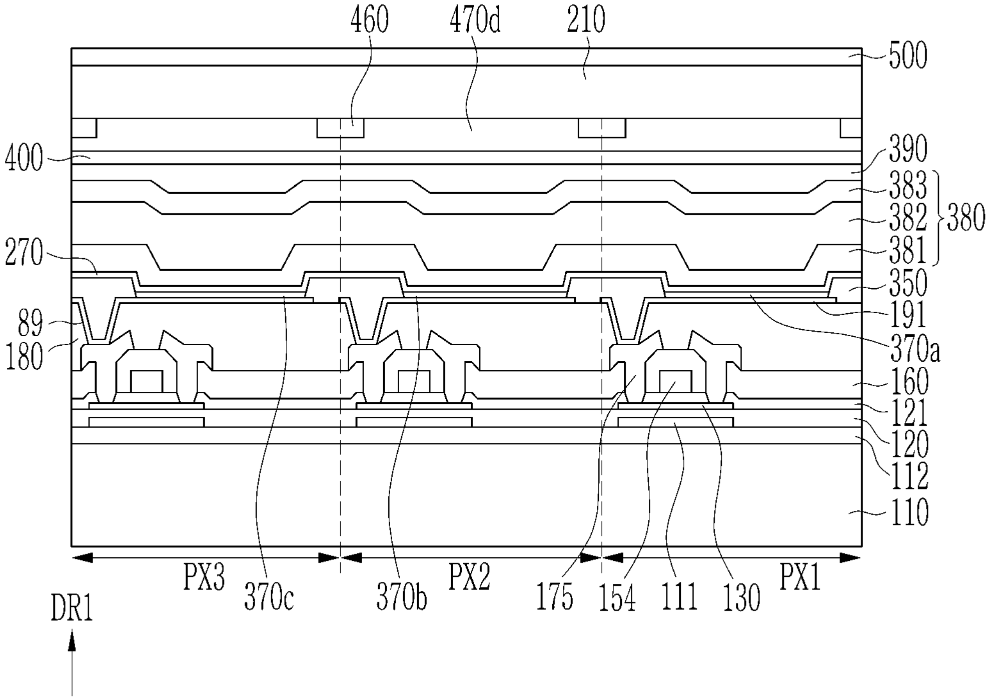
Figure 18:
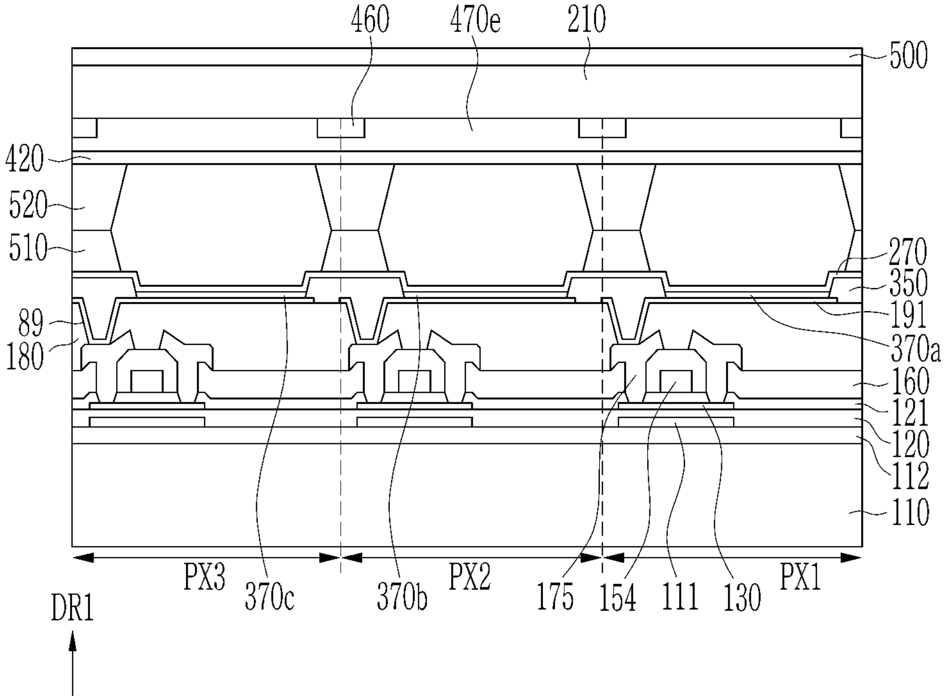

FIG. 16, FIG. 17, and FIG. 18 each illustrate a cross-sectional view of a display device according to an embodiment, First, the embodiment of a display device shown in FIG. 16 is substantially the same as the display device according to the embodiment of FIG. 1 described above, except that instead of the control layer 470, a control layer 470*c* may be disposed on a plurality of color filters 450*a*, 450*b*, and 450*c* and the light blocking member 460. The control layer 470*c* may have a same function as the control layer 470, but may be disposed not only on the second pixel PX2 but also on pixels displaying other colors. FIG. 16 illustrates an embodiment in which the control layer 470*c* is formed not only on second pixel PX2 but also on the first pixel PX1 and the third pixel PX3. In addition, a configuration of the display device according to the embodiment illustrated in FIG. 16 may be the same as that of the display device according to the embodiment illustrated in FIG. 1.

Next, the embodiment of the display device shown in FIG. 17 is substantially the same as the display device according to the embodiment of FIG. 2, except that a control layer 470*d* may be disposed on the cover layer 400 instead of the control layer 470*a*. The control layer 470*d* may have a same function as the control layer 470*a*, but may be disposed not only on the second pixel PX2 but also on pixels displaying other colors. FIG. 17 illustrates an embodiment in which the control layer 470*d* is formed not only on second pixel PX2 but also on the first pixel PX1 and the third pixel PX3. In addition, a configuration of the display device according to the embodiment illustrated in FIG. 17 may be the same as that of the display device according to the embodiment illustrated in FIG. 2.

Next, the embodiment of the display device shown in FIG. 18 is substantially the same as the display device according to the embodiment of FIG. 3, except that a control layer 470*e* may be disposed on the lower surface of the substrate 210 instead of the control layer 470*b*. The control layer 470*e* may have a same function as the control layer 470*b*, but may be disposed not only on the second pixel PX2 but also on pixels displaying other colors. FIG. 18 illustrates an embodiment in which the control layer 470*e* is formed not only on second pixel PX2 but also on the first pixel PX1 and the third pixel PX3. In addition, a configuration of the display device according to the embodiment illustrated in FIG. 18 may be the same as that of the display device according to the embodiment illustrated in FIG. 3.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising a plurality of pixels including a first pixel representing green and disposed on a substrate, wherein each of the pixels comprises a light emitting element including an anode, a light emitting layer, and a cathode, the display device further comprises a control layer disposed in a direction in which the light emitting element emits light and overlapping the first pixel, and a transmittance of the control layer at a first wavelength band, which is within a green wavelength band and a portion of the green wavelength band, is lower than a transmittance at a remaining visible light region such that a decrease in a front luminance spectrum, viewed from a front direction normal to a surface of the substrate, by the control layer is greater than a decrease in a side luminance spectrum, viewed from a side direction at a predetermined angle from the front direction, by the control layer.

2. The display device of claim 1, wherein the first wavelength band is greater than a peak of a Y spectrum of light emitted from the first pixel, wherein the Y spectrum reflects luminance among three stimulus values of an XYZ color system.

3. The display device of claim 1, wherein the first wavelength band is about 600 nm or less.

4. The display device of claim 3, wherein the first wavelength band is about 550 nm or greater.

5. The display device of claim 1, wherein the transmittance of the control layer at the first wavelength band is greater than or equal to 0 and less than 1.

6. The display device of claim 1, wherein the light emitted from the light emitting element is optically resonated between the anode and the cathode and emitted to an outside through the control layer.

7. The display device of claim 6, further comprising a plurality of color filters positioned corresponding to each of the pixels, and the control layer is positioned on a first color filter corresponding to the first pixel.

8. The display device of claim 7, further comprising a color conversion layer or a transmission layer disposed between the light emitting element and the color filters, wherein the color conversion layer includes a semiconductor nanocrystal which converts the light emitted from the light emitting element.

9. The display device of claim 8, wherein the light emitting layer includes a light emitting material which emits blue light.

10. The display device of claim 1, wherein the pixels further include a second pixel representing a different color from the first pixel, wherein the control layer includes a portion overlapping the second pixel.

11. A display device comprising:
a substrate on which a plurality of pixels is defined;
a plurality of transistors positioned on the substrate;
a plurality of light emitting elements positioned on the transistors; and
a control layer disposed on the light emitting elements,
wherein a transmittance of the control layer at a first wavelength band, which is within a wavelength band of a first color represented by at least one of the plurality of pixels and a portion of the wavelength band of the first color, is lower than a transmittance at a remaining visible light region such that a decrease in a front luminance spectrum, viewed from a front direction normal to a surface of the substrate, by the control layer is greater than a decrease in a side luminance spectrum, viewed from a side direction at a predetermined angle from the front direction, by the control layer.

12. The display device of claim 11, wherein the first wavelength band is greater than a peak of a Y spectrum of light emitted from a pixel representing the first color, wherein the Y spectrum reflects luminance among three stimulus values of an XYZ color system.

13. The display device of claim 11, wherein the first wavelength band is about 600 nm or less.

14. The display device of claim 13, wherein the first wavelength band is about 550 nm or greater.

15. The display device of claim 11, wherein the transmittance of the control layer at the first wavelength band is greater than or equal to 0 and less than 1.

16. The display device of claim 11, wherein light emitted from the light emitting elements is optically resonated between an anode and a cathode and emitted to an outside through the control layer.

17. The display device of claim 16, further comprising a plurality of color filters positioned corresponding to each of the pixels, wherein the control layer is positioned on a first color filter corresponding to a pixel representing the first color.

18. The display device of claim 17, further comprising a color conversion layer or a transmission layer disposed between the light emitting elements and the color filters, wherein the color conversion layer includes a semiconductor nanocrystal which converts light emitted from the light emitting elements.

19. The display device of claim 11, wherein the control layer includes a portion overlapping a plurality of pixels representing a plurality of colors.

20. A display device comprising
a plurality of pixels including a first pixel representing green and disposed on a substrate,
wherein each of the pixels includes a light emitting element including an anode, a light emitting layer, and a cathode,
the display device further comprises a control layer disposed in a direction in which the light emitting element emits light and overlapping the first pixel, and
a transmittance spectrum of the control layer has a peak wavelength closer to a peak wavelength of a luminance spectrum of a green color displayed by the first pixel when viewed from a side direction at a predetermined angle from a front direction, which is normal to a surface of the substrate, than to a peak wavelength of a luminance spectrum of the green color displayed by the first pixel viewed from the front direction.

* * * * *